United States Patent
Wan et al.

(10) Patent No.: US 11,670,561 B2
(45) Date of Patent: Jun. 6, 2023

(54) 3D BUILDUP OF THERMALLY CONDUCTIVE LAYERS TO RESOLVE DIE HEIGHT DIFFERENCES

(71) Applicant: Intel Corporation, Santa Clara, CA (US)

(72) Inventors: Zhimin Wan, Chandler, AZ (US); Chandra Mohan Jha, Tempe, AZ (US); Je-Young Chang, Tempe, AZ (US); Chia-Pin Chiu, Tempe, AZ (US); Liwei Wang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 655 days.

(21) Appl. No.: 16/721,802

(22) Filed: Dec. 19, 2019

(65) Prior Publication Data

US 2021/0193547 A1    Jun. 24, 2021

(51) Int. Cl.
*H01L 23/367* (2006.01)
*H01L 23/31* (2006.01)
(Continued)

(52) U.S. Cl.
CPC ........ *H01L 23/367* (2013.01); *H01L 21/4853* (2013.01); *H01L 21/56* (2013.01);
(Continued)

(58) Field of Classification Search
CPC . H01L 23/367; H01L 23/3157; H01L 23/373; H01L 23/3736; H01L 23/42; H01L 23/5386; H01L 23/5385; H01L 23/3121; H01L 23/36; H01L 23/3731; H01L 25/50; H01L 25/0655; H01L 25/18; H01L 25/16; H01L 21/56; H01L 21/4853
See application file for complete search history.

(56) References Cited

U.S. PATENT DOCUMENTS

| | | | | |
|---|---|---|---|---|
| 2014/0340849 | A1* | 11/2014 | Kim | ........................ H01L 23/36 361/717 |
| 2015/0162307 | A1* | 6/2015 | Chen | ...................... H01L 21/56 438/107 |

(Continued)

*Primary Examiner* — Omar F Mojaddedi
(74) *Attorney, Agent, or Firm* — Schwabe, Williamson & Wyatt, P.C.

(57) ABSTRACT

Embodiments include semiconductor packages and a method to form such packages. A semiconductor package includes first, second, and third microelectronic devices on a package substrate. The first microelectronic device has a top surface substantially coplanar to a top surface of the second microelectronic device. The third microelectronic device has a top surface above the top surfaces of the first and second microelectronic devices. The semiconductor package includes a first conductive layer on the first and second microelectronic devices, and a second conductive layer on the third microelectronic device. The second conductive layer has a thickness less than a thickness of the first conductive layer, and a top surface substantially coplanar to a top surface of the first conductive layer. The semiconductor includes thermal interface materials on the first and second conductive layers. The first and second conductive layers are comprised of copper, silver, boron nitride, or graphene.

25 Claims, 9 Drawing Sheets

(51) Int. Cl.
  *H01L 23/373*  (2006.01)
  *H01L 23/42*   (2006.01)
  *H01L 23/538*  (2006.01)
  *H01L 25/065*  (2023.01)
  *H01L 25/18*   (2023.01)
  *H01L 21/48*   (2006.01)
  *H01L 21/56*   (2006.01)
  *H01L 25/00*   (2006.01)

(52) U.S. Cl.
  CPC ........ *H01L 23/3157* (2013.01); *H01L 23/373* (2013.01); *H01L 23/3736* (2013.01); *H01L 23/42* (2013.01); *H01L 23/5386* (2013.01); *H01L 25/0655* (2013.01); *H01L 25/50* (2013.01)

(56) References Cited

U.S. PATENT DOCUMENTS

| | | | | |
|---|---|---|---|---|
| 2015/0194375 A1* | 7/2015 | Gowda | ............... | H01L 25/0655 257/676 |
| 2016/0218081 A1* | 7/2016 | Kim | ........................ | H01L 23/50 |
| 2018/0374776 A1* | 12/2018 | Liu | ..................... | H01L 25/0655 |
| 2021/0098332 A1* | 4/2021 | Wang | .................. | H01L 23/3735 |
| 2022/0367435 A1* | 11/2022 | Hung | ....................... | H01L 25/50 |

\* cited by examiner

3D BUILDUP OF THERMALLY CONDUCTIVE LAYERS TO RESOLVE DIE HEIGHT DIFFERENCES

FIELD

Embodiments relate to packaging semiconductor devices. More particularly, the embodiments relate to semiconductor devices with dies of varying heights and three-dimensional buildup of thermally conductive layers to resolve die height differences.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as microelectronic packages, while optimizing the performance of each device, however is not without issue.

One main issue involves the thermal management of such packages. For example, thermal management of microelectronic packages is becoming extremely important as the power requirements and the number of dies of the microelectronic packages steadily increase. These microelectronic packages typically include high power memory dies and high power and high density stacked dies. Typically, the performance of the microelectronic packages is limited by the different die heights of these memory and stacked dies.

Currently, for example, the microelectronic packages may have a die height delta due to the stacked dies having a height of approximately 280 um, and the memory dies having a height of approximately 720 um. This large die height delta leads to several issues, including increased high thermal resistances in these microelectronic packages. As such, existing packaging solutions may implement an integrated heat spreader (IHS) with recessed pedestals on the stacked dies, or a thicker thermal interface material (TIM) on the stacked dies, to attempt addressing the die height issues. Such existing packaging solutions, however, may substantially increase packaging costs, time, and uncertainty such as leading to other unexpected issues. Furthermore, implementing the recessed pedestals of the IHS typically leaves the edges of the stacked dies uncovered, which results in hotspots on the uncovered edges and higher thermal resistances. Meanwhile, implementing thicker TIMs also presents higher thermal resistances, which limits the thermal design power capabilities of such packages.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1:
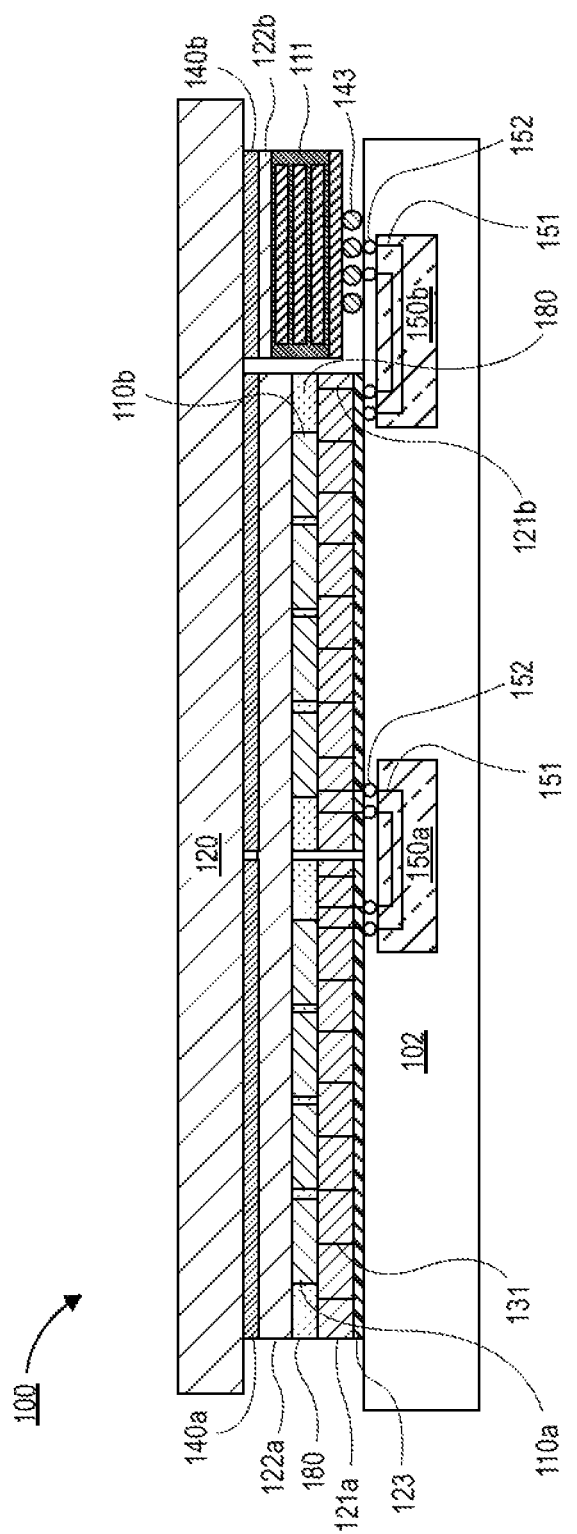
FIG. 1 is an illustration of a cross-sectional view of a semiconductor package with an integrated heat spreader (IHS), a thermal interface material (TIM), a first conductive layer, a second conductive layer, a plurality of microelectronic devices, and a package substrate with a plurality of bridges, according to one embodiment.

Described herein are semiconductor packages with three-dimensional (3D) buildup thermally conductive (e.g., copper) layers and methods of forming such semiconductor packages. The semiconductor packages described below and methods of forming such semiconductor packages may include an integrated heat spreader (IHS), a thermal interface material (TIM), a first conductive layer, a second conductive layer, a plurality of microelectronic devices (e.g., a die, a stack of dies, etc.), and a package substrate with a plurality of bridges. Accordingly, in the embodiments described below, the first and second conductive layers (i.e., the 3D buildup thermally conductive layers) may be stacked directly on the microelectronic devices (hereinafter referred to as "the devices") that may include a first device, a second device, and a third device, where the first conductive layer may be stacked directly on both the first and second devices, and the second conductive layer may be stacked directly on the third device.

In these embodiments, the first and second conductive layers may be coupled with one or more conductive slugs (or 3D buildup thermally conductive slugs). The first and second conductive layers described herein may have different thicknesses (or heights/z-heights) to eliminate any device thickness delta(s). These conductive layers and slugs may be implemented using a cold spray process, an electroplating process, a 3D printing process, and/or the like.

The embodiments described herein provide improvements to existing packaging solutions by implementing (or disposing/covering) the first conductive layer directly over the entire footprint (or top surface area) of the first and second devices to substantially reduce the formation (or possibility) of hotspots. Additionally, the embodiments provide improvements to existing packaging by substantially increasing the overall thermal conductivity of the semiconductor packages with the first and second conductive layers. For example, in these embodiments, the first and second conductive layers may have a thermal conductive of approximately 400 W/mK or greater as compared to existing TIMs such as a polymer TIM (PTIM), a solder TIM (STIM), an indium-based STIM, and/or the like. The embodiments described herein further improve existing technologies by implementing the first and second conductive layers (or the first, second, and third conductive layers) with different thicknesses directly on the top surfaces of the devices to substantially remove (or minimize) any device thickness variations. Furthermore, in these embodiments, the first and second conductive layers having different thicknesses enable substantially reduced thermal resistances and overall increased thermal design power (TDP) capabilities for the semiconductor packages described herein.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with IHSs, TIMs, first and second conductive layers with different thicknesses, conductive slugs, devices, and package substrates with embedded bridge dies.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1, a cross-sectional illustration of a semiconductor package 100 is shown, in accordance with an embodiment. For some embodiments, the semiconductor package 100 may include an IHS 120, a TIM 140*a-b*, a first conductive layer 122*a*, a second conductive layer 122*b*, a plurality of microelectronic devices 110*a-b*, 111, and 121*a-b*, an encapsulation layer 180, and a package substrate 102, according to one embodiment. In these embodiments, a plurality of microelectronic devices 110*a-b* may include a first microelectronic device 110*a* and 121*a*, a second microelectronic device 110*b* and 121*b*, and a third microelectronic device 111. That is, in the embodiments described herein, the first microelectronic device includes a plurality of first top dies 110*a* disposed (or stacked) on a first bottom die 121*a*; the second microelectronic device includes a plurality of second top dies 110*b* disposed (or stacked) on a second bottom die 121*b*; and the third microelectronic device may be a die 111 (e.g., a high bandwidth memory (HBM) die, a stack of dies, a stack of HBM dies, etc.).

Additionally, in some embodiments, the bottom dies 121*a-b* (or first dies) may be disposed and coupled onto the top surface of the package substrate 102 with an adhesive layer 123 (or the like). For one embodiment, the top dies 110*a-b* (or the second dies) may be respectively disposed and coupled onto the bottom dies 121*a-b*, where the encapsulation layer 180 may surround the top dies 110*a-b*. In another embodiment, the die 111 (or third die) may be disposed and coupled onto the top surface of the package substrate 102 with a plurality of solder balls 143 (or the like), where the die 111 may be positioned closely adjacent to the top dies 110*a-b* and bottom dies 121*a-b*. In these embodiments, the stack of top dies 110*a-b* and bottom dies 121*a-b* may be implemented as embedded chiplet dies stacked on base dies, while the die 111 may be implemented as a semiconductor die, a memory die (e.g., a HBM), and/or a stack of dies (e.g., a stack of HBM dies). As described herein, a "stack of dies" may refer to two or more dies (e.g., HBM dies) that are stacked on top of each other. While, in another embodiment, the "stack of dies" may also refer to a single monolithic die comprised of one or more stacked dies that are encapsulated (or molded/embedded) within the single monolithic die.

In some embodiments, the bottom dies 121*a-b* may include a plurality of interconnects 131 that couple the package substrate 102 to the respective top dies 110*a-b*. In these embodiments, the interconnects 131 may be through-silicon vias (TSVs), through-glass vias (TGVs), and/or the like. In some embodiments, as described above, the semiconductor package 100 may dispose (i) the first conductive layer 122*a* (e.g., a copper layer) directly on the top surfaces of the top dies 110*a-b* and the encapsulation layer 180, and (ii) the second conductive layer 122*b* directly on the top surface of the die 111. In addition, as shown in FIG. 1, the first conductive layer 122*a* may have a thickness that is greater than a thickness of the second conductive layer 122*b*. While, in an alternate embodiment, the first conductive layer 122*a* may have a thickness that is less than a thickness of the second conductive layer 122*b*, when the top surface of the top dies 110*a-b* is positioned above the top surface of the die 111 in the z-axis. Accordingly, based on the different thicknesses of the first and second conductive layers 122*a-b*, the first conductive layer 122*a* may have a top surface that is substantially coplanar to a top surface of the second conductive layer 122*b*.

For some embodiments, the TIMs 140a-b may be respectively disposed on the top surfaces of the first and second conductive layers 122a-b. In an embodiment, the IHS 120 may be disposed over the TIMs 140a-b and the package substrate 102, where the TIMs 140a-b may thus have thin thicknesses and be directly sandwiched between the IHS 120 and the first and second conductive layers 122a-b. For one embodiment, the IHS 120 may be a heatsink or the like, where the heatsink may be a single shared heatsink or two separated heatsinks.

In an embodiment, a plurality of bridges 150a-b may be disposed in the package substrate 102, where the bridges 150a-b may communicatively couple the stack of top dies 110a-b and bottom dies 121a-b to the die 111. In an embodiment, the bridges 150a-b may comprise electrical routings 151-152 (or interconnect structures) that may communicatively couple the bottom die 121a to the bottom die 121b, and the bottom die 121b to the die 111. In an embodiment, the bridges 150a-b may be a silicon bridge, a glass bridge, or a bridge made of any other substrate material that is suitable for forming bridges. In some embodiments, the bridges 150a-b may be referred to as embedded multi-die interconnect bridges (EMIBs). For additional embodiments, the bridges 150a-b may include a plurality of TSVs that may be used to communicatively couple the bottom dies 121a-b and the die 111.

For one embodiment, the encapsulation layer 180 may be disposed over the bottom dies 121a-b, where the encapsulation layer 180 also surrounds the top dies 110a-b. Additionally, as shown in FIG. 1, the encapsulation layer 180 may embed and be disposed in between the top dies 110a-b, where the encapsulation layer 180 may be disposed (or sandwiched) between the top surfaces of the bottom dies 121a-b and the bottom surface of the first conductive layer 122a. For one embodiment, the top surface of the encapsulation layer 180 may be substantially coplanar to the top surfaces of the top dies 110a-b. In some embodiments, the stack of top dies 110a-b and bottom dies 121a-b may have a thickness that is less than a thickness of the die 111. While, in an alternate embodiment, the stack of top dies 110a-b and bottom dies 121a-b may have a thickness that is greater than a thickness of the die 111. Accordingly, in some embodiments, the semiconductor package 100 may implement the different thicknesses of the first and second conductive layers 122a-b (i) to offset the different thicknesses of the die 111 and the stack of top dies 110a-b and bottom dies 121a-b, (ii) to subsequently coplanarize the top surfaces of the first and second conductive layers 122a-b, and (iii) to therefore substantially reduce the overall thermal resistance and increase the overall TDP capabilities.

Note that, according to some embodiments, the semiconductor package 100 is merely one example of an embodiment of a semiconductor packaged system. That is, the semiconductor package 100 is not limited to the illustrated semiconductor packaged system, and thus may be designed/formed with fewer, alternate, or additional packaging components and/or with different interconnecting structures. For example, while one IHS 120, two TIMs 140a-b, two conductive layers 122a-b, two bottom dies 121a-b, two sets of top dies 110a-b, one die 111, and one package substrate 102 with two bridges 150 are illustrated, it is to be appreciated that the semiconductor package 100 may include any number of IHSs 120, TIMs 140a-b, conductive layers 122a-b, bottom dies 121a-b, sets of top dies 110a-b, die 111, and package substrates 102 with bridges 150.

For one embodiment, the semiconductor package 100 may include a ball grid array (BGA) package, a land grid array (LGA) package, and/or a pin grid array (PGA) package. In other embodiments, one or more of the bottom dies 121a-b, the top dies 110a-b, the die 111, and/or the package substrate 102 may be coupled via solder balls (or the like)—e.g., such as the solder balls 143—that may be implemented as solder bumps/joints formed from respective microbumps. A solder ball (or joint) formed by soldering of a microbump according to an embodiment may itself be referred to as a "bump" and/or a "microbump." Additionally, for other embodiments, one or more of the top dies 110a-b, the bottom dies 121a-b, and the package substrate 102 may be coupled using an anisotropic conductive film (ACF) or the like.

The package substrate 102 may include a variety of electronic structures formed thereon or therein. In certain embodiments, the package substrate 102 may be an organic substrate made up of one or more layers of polymer base materials or ceramic base materials, with conducting regions for transmitting signals. For some embodiments, the package substrate 102 may include, but is not limited to, a package, a substrate, a printed circuit board (PCB), and a motherboard. In one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where the dielectric layers may be a photosensitive dielectric layer. For one embodiment, the PCB 102 may also include one or more conductive layers, which may further include copper (or metallic) traces, lines, pads, vias, holes, and/or planes.

For one embodiment, the bottom dies 121a-b, the top dies 110a-b, and the die 111 may be comprised, but are not limited to, a semiconductor die, an electronic device (e.g., a wireless device), an integrated circuit (IC), a central processing unit (CPU), a graphic processing unit (GPU), a microprocessor, a platform controller hub (PCH), a memory (e.g., a HBM), and/or a field-programmable gate array (FPGA). Additionally, in other embodiments, the bottom dies 121a-b may be comprised of one or more materials, including glass, crystal, diamond, low thermal conductive materials, high thermal conductive materials (e.g., gallium nitride (GaN) or the like), silicon, glass-based materials, and/or silicon-based materials (e.g., silicon carbide (SiC) or the like). As described above, in some embodiments, the top dies 110a-b may be a plurality of chiplet dies. While, in another embodiment, the top dies 110a and/or the top dies 110b may be a single monolithic die instead of multiple chiplet dies. For one embodiment, the die 111 may be a stack of dies such as a stack of HBM dies. The bottom dies 121a-b, the top dies 110a-b, and the die 111 may be formed from a material such as silicon and have circuitry thereon that is to be coupled to the package substrate 102 and/or each other. Although some embodiments are not limited in this regard, the package substrate 102 may in turn be coupled to another body, for example, a computer motherboard (or the like).

For one embodiment, the bottom dies 121a may have a thickness that is substantially equal to a thickness of the bottom dies 121b. For one embodiment, the bottom dies 121a-b may have a thickness of approximately 100 um or less. In some embodiments, the top dies 110a may have a thickness that is substantially equal to a thickness of the top dies 110b. For one embodiment, the top dies 110a-b may have a thickness of approximately 200 um to 600 um. In some embodiments, the top dies 110a-b may have a thickness that is substantially equal or different from a thickness of bottom dies 121a-b. For one embodiment, the top dies 110a-b may have a top surface that is substantially coplanar to a top surface of the encapsulation layer 180. Additionally, in these embodiments, the top surface of the top dies 110a-b may be positioned below the top surface of the die 111. While, in an alternate embodiment, the top surface of the top dies 110a-b may be positioned above the top surface of the die 111. In one embodiment, the die 111 may have a thickness of approximately 720 um. For other embodiments, the die 111 may have a thickness of approximately 800 um or less. Note that, in some embodiments, the thicknesses of the TIMs 140a disposed over the top dies 110a-b may be substantially equal to the thickness of the TIM 140b that is disposed over the die 111. For one embodiment, the TIMs 140a-b may have a thickness of approximately 25 um to 400 um.

One or more connections between the package substrate 102, the top dies 110a-b, the bottom dies 121a-b, and the die 111 may include one or more interconnect structures (e.g., such as the solder balls 143) and underfill layers if desired. In some embodiments, these interconnect structures (or connections) may variously comprise an alloy of nickel, palladium, and tin (and, in some embodiments, copper). For one embodiment, the underfill layers may be one or more polymer materials that are injected between the respective components. Alternatively, the underfill layers may be molded underfills (MUF) or the like.

In one embodiment, the encapsulation layer 180 may fully surround the outer sidewalls of the top dies 110a-b. Note that, in alternate embodiments, the encapsulation layer 180 may be implemented to partially or fully surround the bottom dies 121a-b. In some embodiments the encapsulation layer 180 may include one or more encapsulation materials such as a mold material, an underfill material, a filler material, any similar materials, and/or any combination thereof. Accordingly, the first conductive layer 122a may be directly disposed on the top surfaces of the encapsulation layer 180 and the top dies 110a-b.

According to some embodiments, the first and second conductive layers 122a-b may be comprised of copper or the like. Likewise, in some embodiments, the first and second conductive layers 122a-b may be comprised of one or more highly thermal conductive materials, such as, but not limited to, copper, silver, boron nitride, graphene, and/or the like. For example, in these embodiments, the first and second conductive layers 122a-b may have a high thermal conductivity of approximately 400 W/mK or greater.

In some embodiments, the first conductive layer 122a may have a thickness of approximately 100 um to 500 um. While, in other embodiments, the first conductive layer 122a may have a thickness of approximately 500 um or less. Note that, as shown in FIG. 1, the first conductive layer 122a may be a single/shared conductive layer that is disposed over both the top dies 110a-b and that entirely covers (or extends over) the top surfaces of the encapsulation layer 180 and the top dies 110a-b. Alternatively, in another embodiment, the first conductive layer 122a may be a split conductive layer that is separated into two separate conductive layers with substantially equal thicknesses (or different thicknesses when the respective top dies have different thicknesses), where one conductive layer may be disposed over the top dies 110a, and the other conductive layer may be disposed over the top dies 110b. In this alternative embodiment, each of the split/separated conductive layers may entirely cover (or extend over) the top surfaces of the encapsulation layer 180 and the respective top dies 110a-b.

Likewise, as described above, the second conductive layer 122b may be directly disposed on the top surface of the die 111. In some embodiments, the second conductive layer 122b may have a thickness of approximately 100 um or less. Note that, in an alternate embodiment, the second conductive layer 122b may have a thickness that is greater than a thickness of the first conductive layer 122a, when the top surface of the top dies 110a-b is positioned above the top surface of the die 111 in the z-axis. Furthermore, as described above and based on these thicknesses described herein, the top surface of the first conductive layer 122a may be substantially coplanar to the top surface of the second conductive layer 122b. In some embodiments, the first and second conductive layers 122a-b may be disposed with a cold spray process, an electroplating process, a 3D printing process, and/or the like. Furthermore, in such embodiments, the top surfaces of the first and second conductive layers 122a-b may be grinded/polished with a polishing process (or the like) that implements flat top surfaces with substantially coplanar z-heights.

Furthermore, the TIMs 140a-b may be directly disposed and coupled onto the top surfaces of the respective first and second conductive layers 122a-b, where the TIMs 140a-b may be positioned between the top surfaces of the first and second conductive layers 122a-b and the bottom surface of the IHS 120. In one embodiment, the TIMs 140a-b may be a STIM such as an indium STIM or the like. In other embodiments, the TIMs 140a-b may include one or more highly thermal conductivity materials such as a metallic TIM, a STIM, a PTIM, and/or any similar highly thermal conductive material(s). In some embodiments, the TIM 140a may have a thickness that is substantially equal to a thickness of the TIM 140b. The TIM 140a may be two split/separated TIMs or one single/shared TIM based on the desired packaging design.

In one embodiment, the IHS 120 may be disposed over the TIMs 140a-b and the package substrate 102. The IHS 120 may be manufactured (or shaped) to include a lid and/or a plurality of legs (or pedestals), where the lid of the IHS 120 may be directly disposed on the top surfaces of the TIMs 140a-b, and the legs of the IHS 120 may be directly disposed on the top surface of the package substrate 102. In some embodiments, the IHS 120 may be a heatsink, a heat spreader, a heat exchanger, a manifold, a cold plate, and/or any similar thermal solution (or device) that may be used to help transfer the heat from the electrical components of the semiconductor package 100 to the ambient environment (or an additional heat spreader). In some embodiments, the IHS 120 may be a shared heatsink disposed over both the top dies 110a-b and the die 111, or the IHS 120 may be a split heatsink separated into two separate heatsinks, where one separated IHS may be disposed only over the top dies 110a-b, and the other separated IHS may be disposed only over the die 111.

Note that the semiconductor package 100 may include fewer or additional packaging components based on the desired packaging design.

Figure 2A:
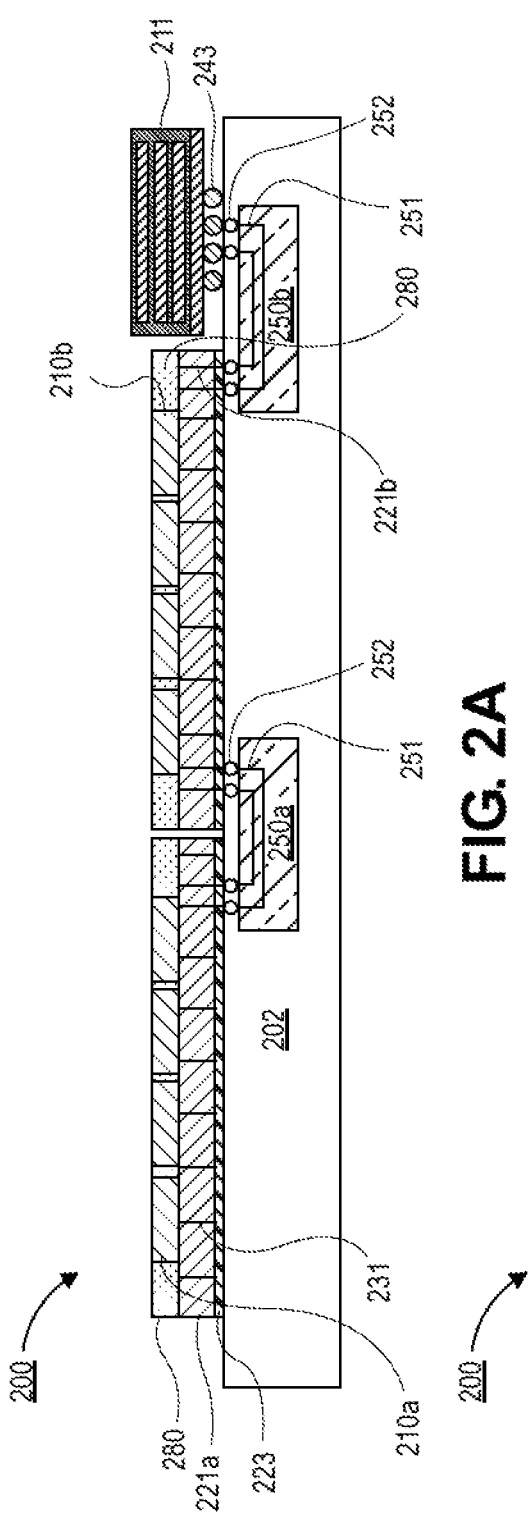
FIGS. 2A-2C are illustrations of cross-sectional views of a semiconductor package with an IHS, a TIM, a first conductive layer, a second conductive layer, a plurality of microelectronic devices, and a package substrate with a plurality of bridges, according to some embodiments.
Figure 2B:
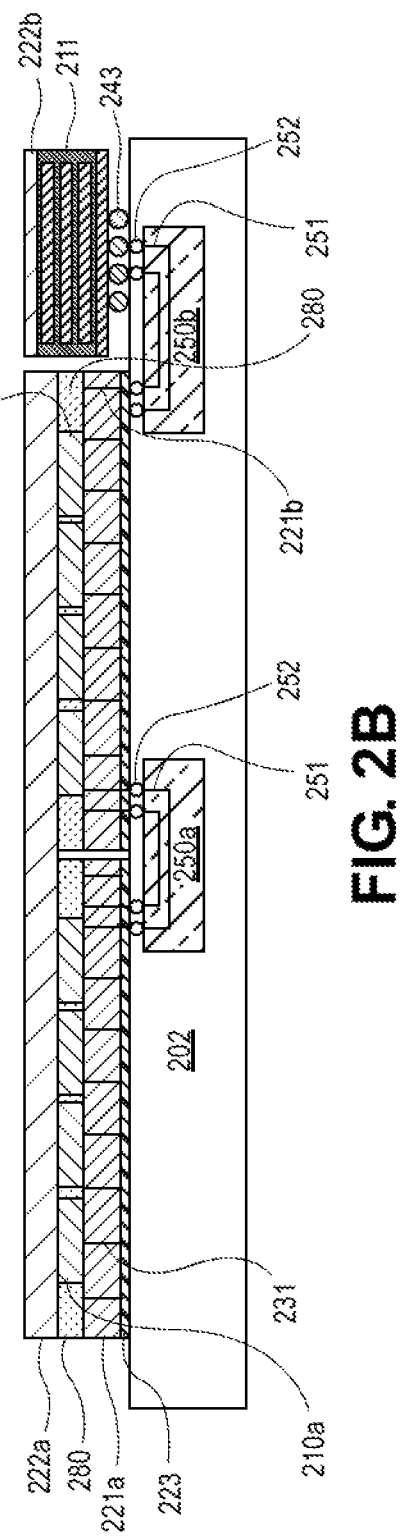
Figure 2C:
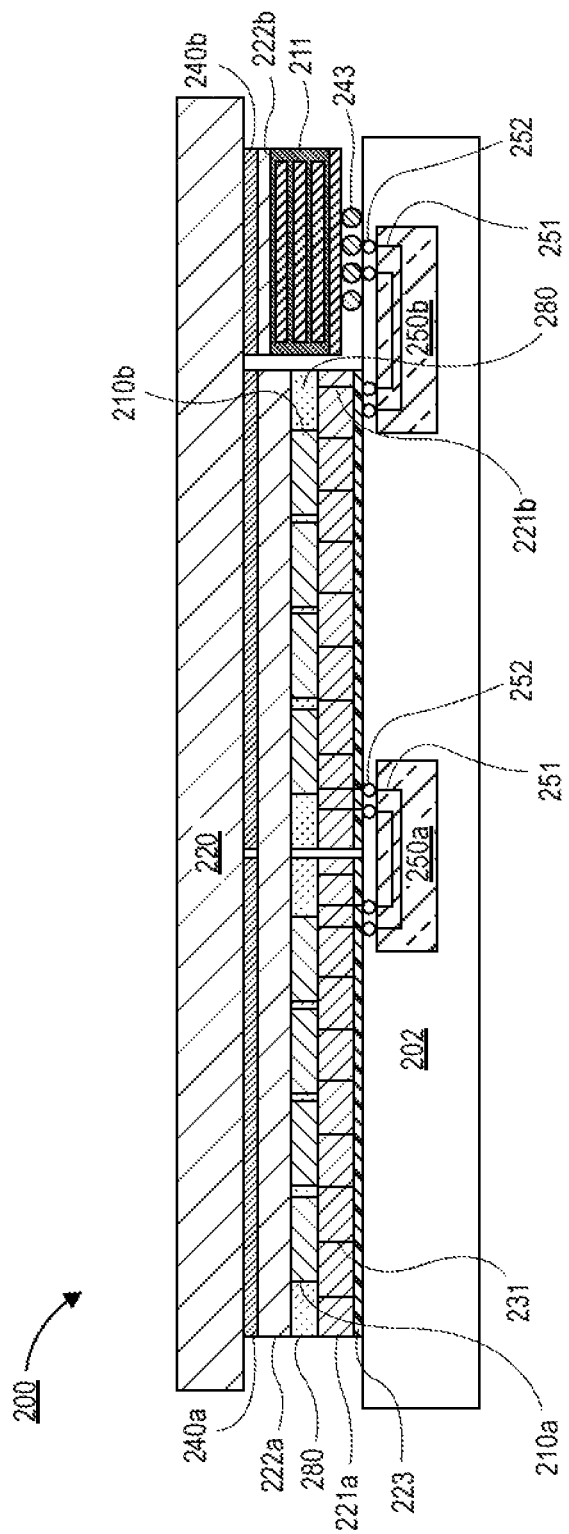

FIGS. 2A-2C are cross-sectional illustrations of a semiconductor package 200, in accordance with some embodiments. For some embodiments, as shown in FIGS. 2A-2C, the semiconductor package 200 may include an IHS 220, a TIM 240a-b, a first conductive layer 222a, a second conductive layer 222b, a plurality of top dies 210a-b, a plurality of bottom dies 221a-b, a die 211, an encapsulation layer 280, and a package substrate 202 with a plurality of bridges 250a-b. In these embodiments, the semiconductor package 200 of FIGS. 2A-2C with the first and second conductive layers 222a-b may be substantially similar to the semiconductor package 100 with the first and second conductive layers 122a-b described above in FIG. 1.

Likewise, the components of the semiconductor package 200 may be substantially similar to the components of the semiconductor package 100 described above in FIG. 1. Accordingly, the IHS 220, the TIMs 240a-b, the encapsulation layer 280, the first and second conductive layers 222a-b, the top dies 210a-b, the bottom dies 221a-b, the interconnects 231, the adhesive layer 223, the die 211, the solder balls 243, the bridges 250a-b with the electrical routings 251-252, and the package substrate 202 may be substantially similar to the IHS 120, the TIMs 140a-b, the encapsulation layer 180, the first and second conductive layers 122a-b, the top dies 110a-b, the bottom dies 121a-b, the interconnects 131, the adhesive layer 123, the die 111, the solder balls 143, the bridges 150a-b with the electrical routings 151-152, and the package substrate 102 described above in FIG. 1.

Referring now to FIG. 2A, a cross-sectional illustration of a semiconductor package 200 is shown, in accordance with an embodiment. For some embodiments, the semiconductor package 200 may include the top dies 210a-b and bottom dies 221a-b respectively stacked on the package substrate 202, where the bottom dies 221a-b may be coupled to the package substrate 202 with the adhesive layer 223. Likewise, in these embodiments, the semiconductor package 200 may include the die 211 disposed and coupled onto the package substrate 202 with the solder balls 243. The encapsulation layer 280 may be disposed over the top surface of the bottom dies 221a-b and surrounds the top dies 210a-b. In some embodiments, the top surface of the encapsulation layer 280 may be planarized with a polishing/grinding process (or the like) and may thus be substantially coplanar to the top surfaces of the top dies 210a-b. Moreover, the top surfaces of the encapsulation layer 280 and the top dies 210a-b may be positioned below the top surface of the die 211 in the z-axis. That is, the die 211 has a thickness that is greater than a thickness of the stacked top dies 210a-b and bottom dies 221a-b. While, in an alternate embodiment, the top surfaces of the encapsulation layer 280 and the top dies 210a-b may be positioned above the top surface of the die 211 in the z-axis (i.e., in these alternative embodiments, even if not shown in FIGS. 2A-2C, the die 211 may have a thickness less than a thickness of the stacked top dies 210a-b and bottom dies 221a-b if desired).

Referring now to FIG. 2B, a cross-sectional illustration of a semiconductor package 200 is shown, in accordance with an embodiment. For some embodiments, the semiconductor package 200 may dispose the first and second conductive layers 222a-b directly on/over the respective top dies 210a-b and the die 211 with a cold spray process, an electroplating process, a 3D printing process, and/or the like. For example, the first conductive layer 222a may be disposed on and entirely cover the top surfaces of the encapsulation layer 280 and the top dies 210a-b. Also, the second conductive layer 222b may be disposed on the top surface of the die 211. Furthermore, in such embodiments, a polishing process (or the like) may grind/polish the top surfaces of the first and second conductive layers 222a-b, where the first and second conductive layers 222a-b may subsequently have flat top surfaces and substantially coplanar z-heights to each other. As such, after the grinding/polishing process, the top surface of the first conductive layer 222a may be substantially coplanar to the top surface of the second conductive layer 222b.

Referring now to FIG. 2C, a cross-sectional illustration of a semiconductor package 200 is shown, in accordance with an embodiment. For some embodiments, the TIMs 240a-b may be directly disposed and coupled onto the top surfaces of the respective first and second conductive layers 222a-b, where the TIMs 240a-b may be positioned between the top surfaces of the first and second conductive layers 222a-b and the bottom surface of the IHS 220. In one embodiment, the TIMs 240a-b may be a STIM such as an indium STIM or the like. In other embodiments, the TIMs 240a-b may include one or more highly thermal conductivity materials such as a metallic TIM, a STIM, a PTIM, and/or any similar highly thermal conductive material(s).

In some embodiments, the TIM 240a may have a thickness that is substantially equal to a thickness of the TIM 240b. The TIM 240a may be two split/separated TIMs or one single/shared TIM based on the desired packaging design. Lastly, as shown in FIG. 2C, the IHS 220 may be disposed over the TIMs 240a-b and the package substrate 202. Accordingly, the semiconductor package 200 has substantially improved TDP capabilities as (i) the first and second conductive layers 222a-b with the different thicknesses eliminate (or offset) any die thickness delta issues; (ii) the first conductive layer 222a entirely covers the top outer edges of the stack of top dies 210a-b and bottom dies 221a-b, which thereby substantially mitigates (or removes) the formation of hotspots on these top outer edges; and (iii) the first and second conductive layers 222a-b allow for thinner TIMs 240a-b and substantially lower thermal resistances compared to the TIMs 240a-b, which thereby increases the overall thermal conductivity based on the highly thermal conductive material(s) (e.g., copper, silver, etc.) of the first and second conductive layers 222a-b compared to the thermal conductive materials of the TIMs 240a-b (e.g., STIMs, PTIMs, etc.).

Note that the semiconductor package 200 of FIGS. 2A-2C may include fewer or additional packaging components based on the desired packaging design.

Figure 3A:
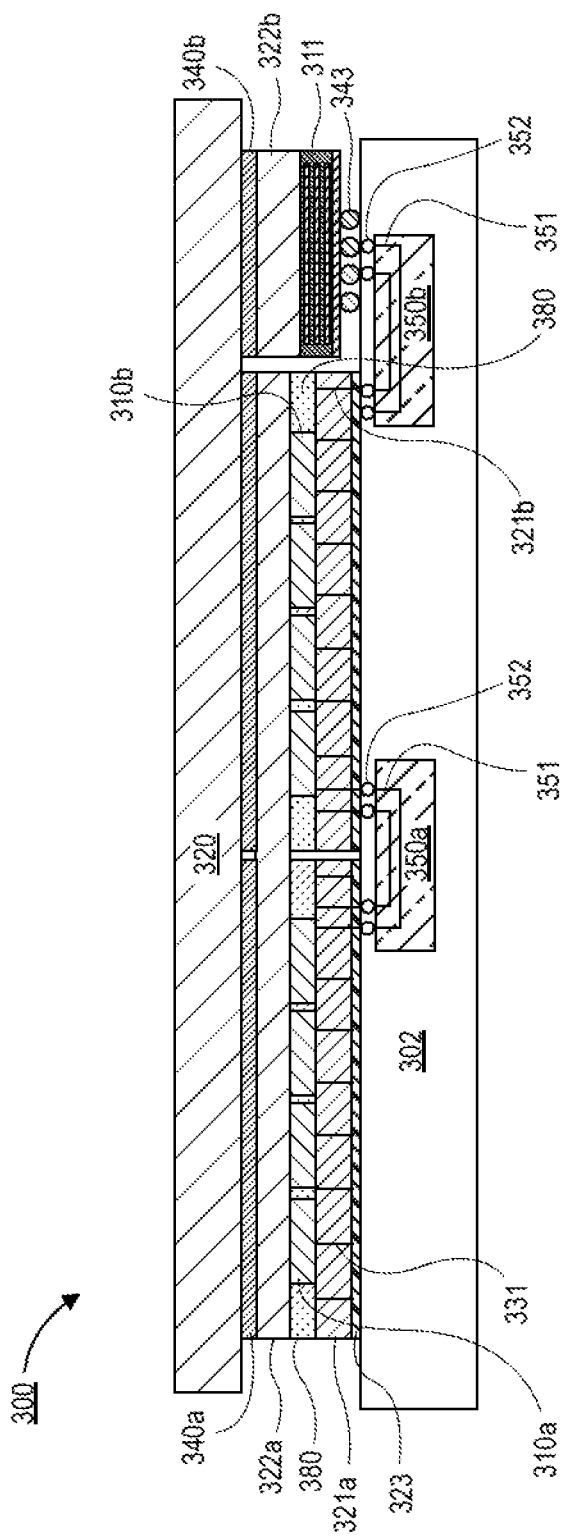
FIGS. 3A-3B are illustrations of cross-sectional views of a semiconductor package with an IHS, a TIM, a first conductive layer, a second conductive layer, a plurality of microelectronic devices, and a package substrate with a plurality of bridges, according to some embodiments.
Figure 3B:
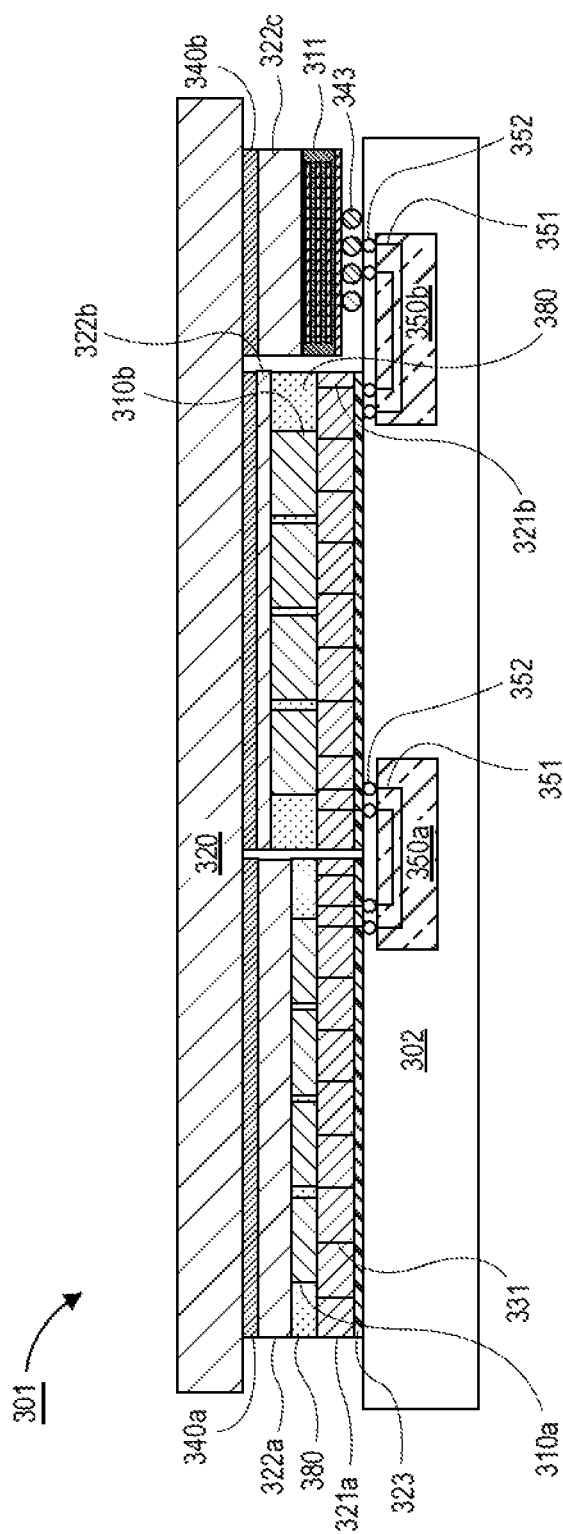
Figure 4A:
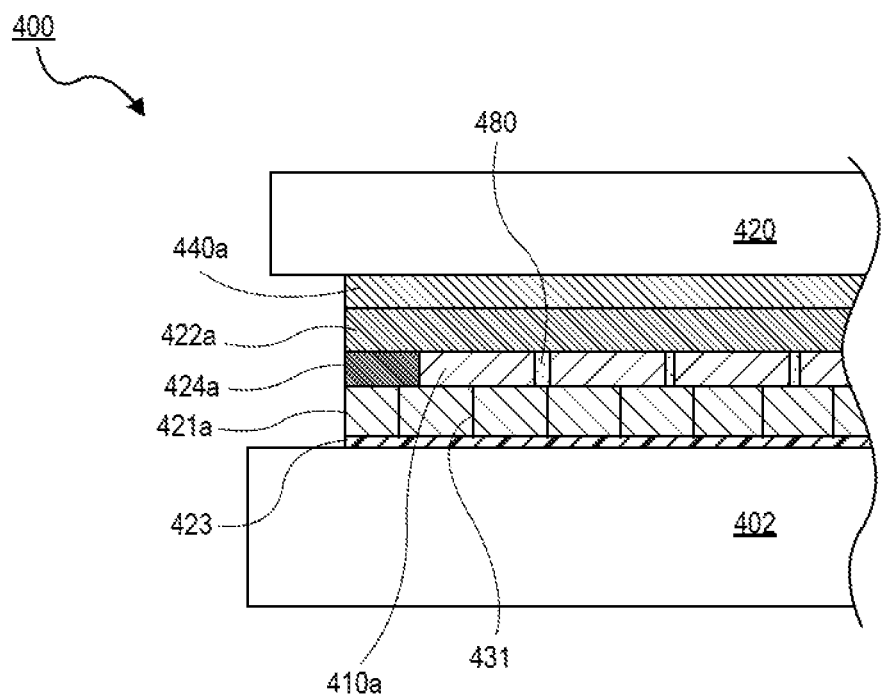
FIGS. 4A-4D are illustrations of cross-sectional views of portions of a semiconductor package with an IHS, a TIM, a first conductive layer, a conductive slug, a plurality of microelectronic devices, and a package substrate with a plurality of bridges, according to some embodiments.
Figure 4B:
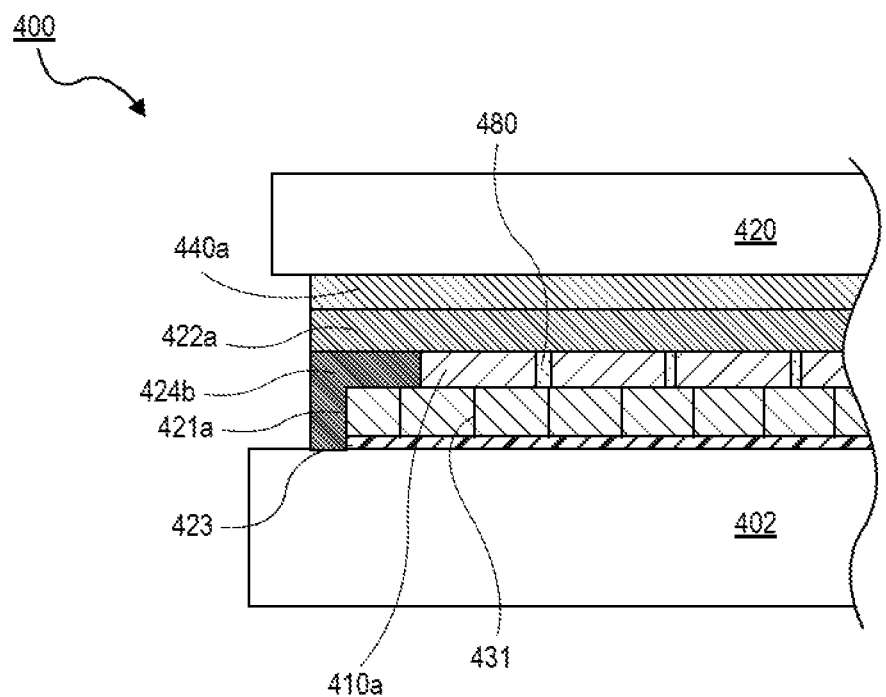
Figure 4C:
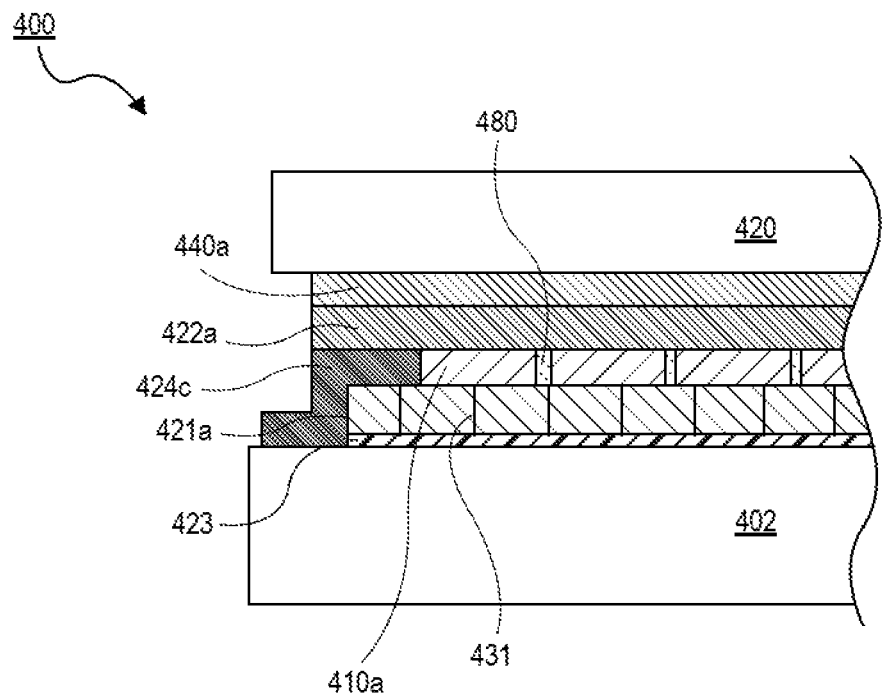
Figure 4D:
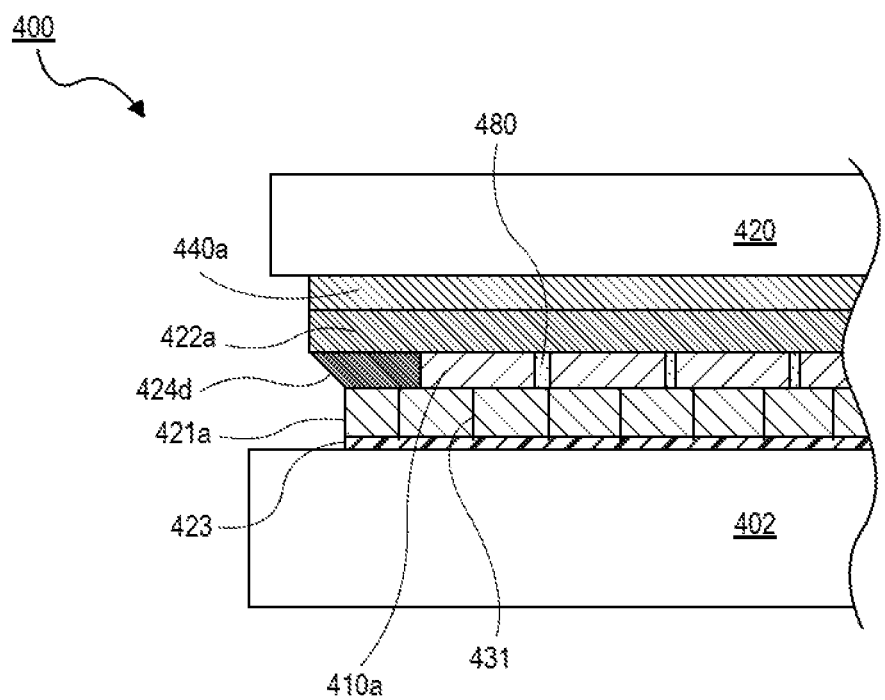

Referring now to FIGS. 3A-3B, cross-sectional illustrations of a plurality of semiconductor packages 300-301 are shown, in accordance with an embodiment. For some embodiments, the semiconductor packages 300-301 may be substantially similar to the semiconductor package 100 described above in FIG. 1, with the exception (i) that the second conductive layer 322b has a thickness that is greater than a thickness of the first conductive layer 322a in the semiconductor package 300 of FIG. 3A, (ii) that the first conductive layer 322a is disposed over the stack of first top and bottom dies 310a and 321a, the second conductive layer 322b is disposed over the stack of second top and bottom dies 310b and 321b in FIG. 3B, and the third conductive layer 322c is disposed over the die 311 in the semiconductor package 301 of FIG. 3B, and (iii) that the third conductive layer 322b has a thickness that is greater than both thicknesses of the first and second conductive layers 322a-b, and the thickness of the first conductive layer 322a is greater than the thickness of the second conductive layer 322b in the semiconductor package 301 of FIG. 3B.

Likewise, as described above, the components of the semiconductor packages 300-301 may be substantially similar to the components of the semiconductor package 100 described above in FIG. 1. Accordingly, the IHS 320, the TIMs 340a-b, the encapsulation layer 380, the first, second, and third conductive layers 322a-c, the top dies 310a-b, the bottom dies 321a-b, the interconnects 331, the adhesive layer 323, the die 311, the solder balls 343, the bridges 350a-b with the electrical routings 351-352, and the package substrate 302 may be substantially similar to the IHS 120, the TIMs 140a-b, the encapsulation layer 180, the first and second conductive layers 122a-b, the top dies 110a-b, the bottom dies 121a-b, the interconnects 131, the adhesive layer 123, the die 111, the solder balls 143, the bridges 150a-b with the electrical routings 151-152, and the package substrate 102 described above in FIG. 1.

Note that the semiconductor packages 300-301 of FIGS. 3A-3B may include fewer or additional packaging components based on the desired packaging design.

Referring now to FIGS. 4A-4D, cross-sectional illustrations of portions of a plurality of semiconductor package 400 are shown, in accordance with an embodiment. For some embodiments, the semiconductor package 400 may be substantially similar to the semiconductor package 100 described above in FIG. 1, with the exception that a plurality of conductive slugs 424a-d are coupled onto the periphery region (or any other desired region(s)) of the bottom surface of the first conductive layer 422a (or the second/third conductive layers) in FIGS. 4A-4C, and that the conductive slugs 424a-d may have one or more different shapes, including the rectangular-shaped conductive slugs 424a shown in FIG. 4A, the L-shaped conductive slugs 424b shown in FIG. 4B, the Z-shaped conductive slugs 424c shown in FIG. 4C, and the trapezoid-shaped conductive slugs 424d shown in FIG. 4D. In these embodiments, the conductive slugs 424a-b of FIGS. 4A-4D may be comprised of one or more highly thermal conductive materials, such as, but not limited to, copper, silver, boron nitride, graphene, and/or the like. For example, in these embodiments, the conductive slugs 424a-b of FIGS. 4A-4D may have a high thermal conductivity of approximately 400 W/mK or greater.

Likewise, as described above, the components of the semiconductor package 400 may be substantially similar to the components of the semiconductor package 100 described above in FIG. 1. Accordingly, the IHS 420, the TIM 440a, the encapsulation layer 480, the first conductive layer 422a, the top dies 410a, the bottom dies 421a, the interconnects 431, the adhesive layer 423, and the package substrate 402 may be substantially similar to the IHS 120, the TIMs 140a-b, the encapsulation layer 180, the first and second conductive layers 122a-b, the top dies 110a-b, the bottom dies 121a-b, the interconnects 131, the adhesive layer 123, the die 111, the solder balls 143, the bridges 150a-b with the electrical routings 151-152, and the package substrate 102 described above in FIG. 1.

Note that the semiconductor package 400 of FIGS. 4A-4D may include fewer or additional packaging components based on the desired packaging design.

Figure 5:
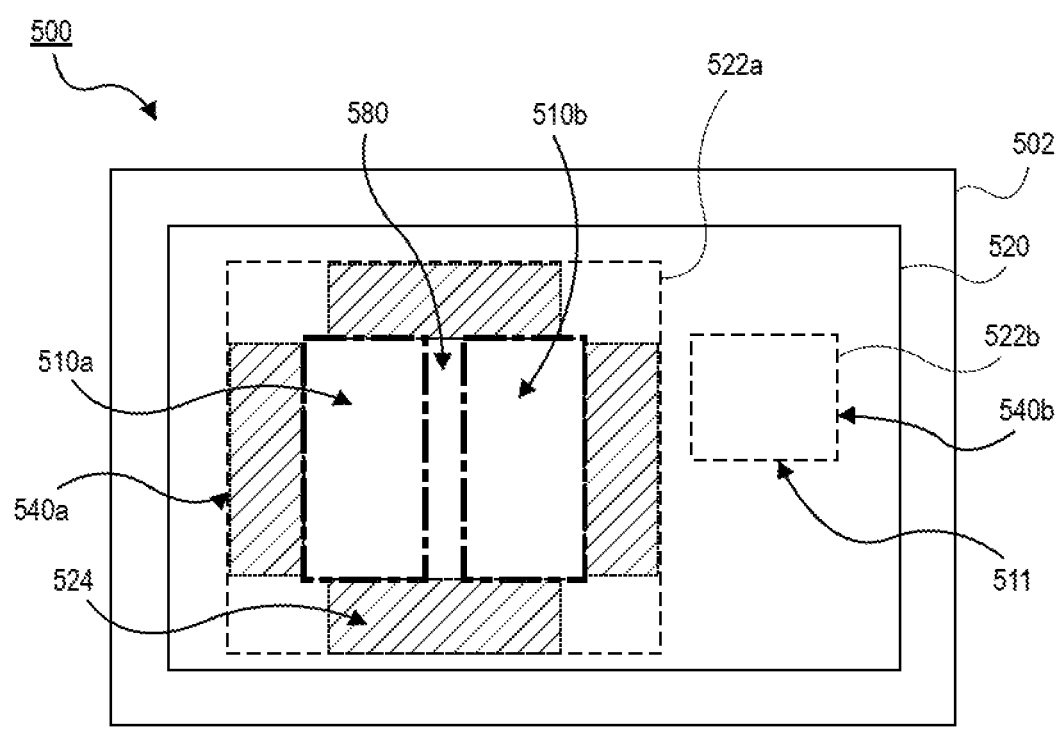
FIG. 5 is an illustration of a plan view of a semiconductor package with an IHS, a TIM, a first conductive layer, a second conductive layer, a plurality of microelectronic devices, and a package substrate, according to one embodiment.

Referring now to FIG. 5, a plan illustration and a respective plan illustration of a semiconductor package 500 is shown, in accordance with an embodiment. For some embodiments, the semiconductor package 500 may be substantially similar to the semiconductor package 100 described above in FIG. 1, with the exception that the semiconductor package 500 includes a plurality of conductive slugs 524 coupled onto the periphery region of the bottom surface of the first conductive layer 522a, and that the conductive slugs 524 are comprised as rectangular-shaped conductive slugs on the periphery region of the top surface of the bottom dies (e.g., the conductive slugs 524 of FIG. 5 may be substantially similar and/or shaped differently as the conductive slugs 424a-d of FIGS. 4A-4D).

Likewise, as described above, the components of the semiconductor package 500 may be substantially similar to the components of the semiconductor package 100 described above in FIG. 1. Accordingly, the IHS 520, the TIMs 540a-b, the encapsulation layer 580, the first and second conductive layers 522a-b, the top dies 510a-b, the die 511, and the package substrate 502 may be substantially similar to the IHS 120, the TIMs 140a-b, the encapsulation layer 180, the first and second conductive layers 122a-b, the top dies 110a-b, the die 111, and the package substrate 102 described above in FIG. 1.

Note that the semiconductor package 500 may include fewer or additional packaging components based on the desired packaging design.

Figure 6:
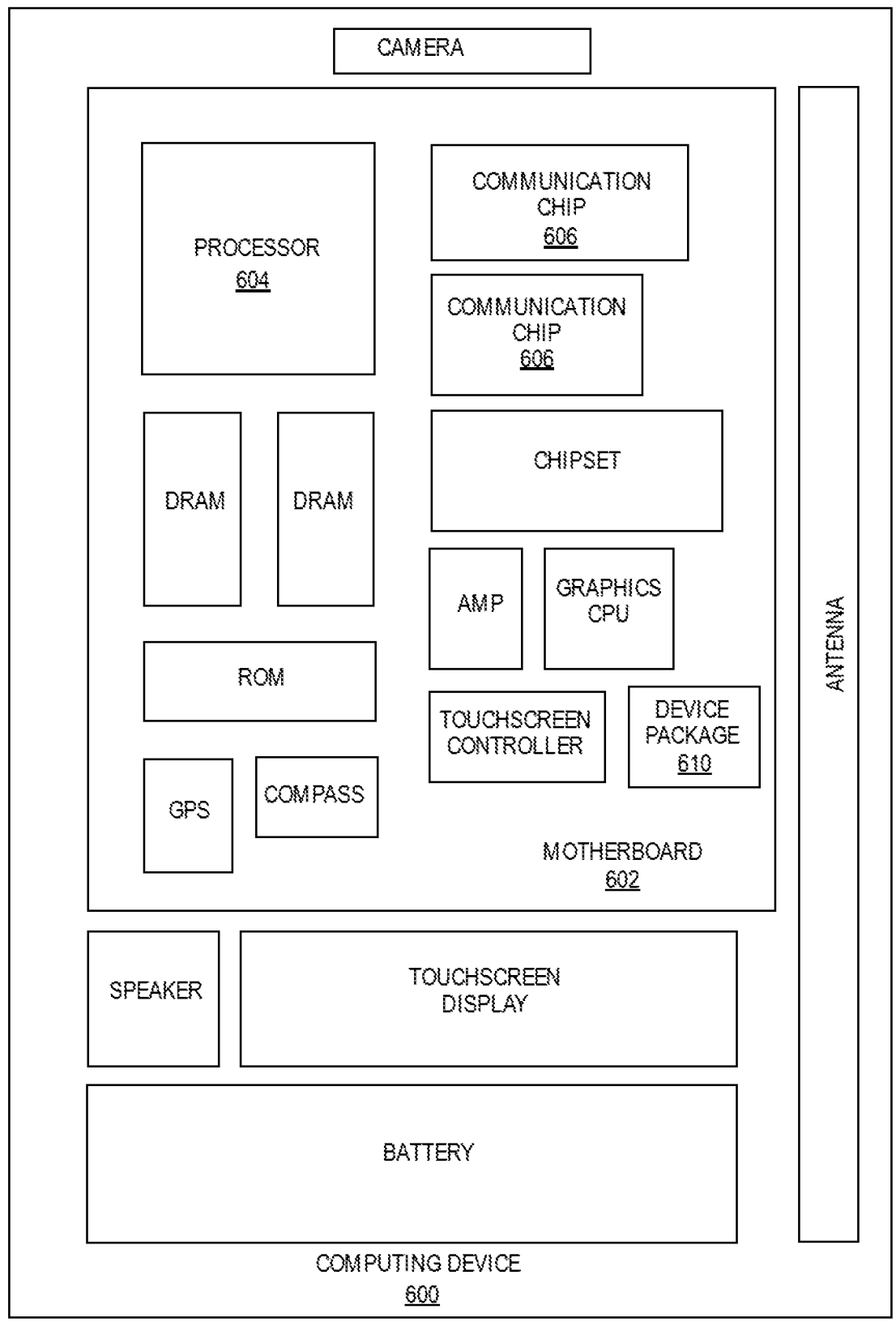
FIG. 6 is an illustration of a schematic block diagram illustrating a computer system that utilizes a semiconductor package with an IHS, a TIM, a first conductive layer, a second conductive layer, a plurality of microelectronic devices, and a package substrate with a plurality of bridges, according to one embodiment.

FIG. 6 is an illustration of a schematic block diagram illustrating a computer system 600 that utilizes a device package 610 (or a semiconductor package) with an IHS, a TIM, a first conductive layer, a second conductive layer, a plurality of conductive slugs, a plurality of top dies, a plurality of bottom dies, a die, and a package substrate with a plurality of bridges, according to one embodiment. FIG. 6 illustrates an example of computing device 600. Computing device 600 houses a motherboard 602. Motherboard 602 may include a number of components, including but not limited to processor 604, device package 610 (or semiconductor package), and at least one communication chip 603. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be a semiconductor package that may include, but is not limited to, a substrate, a package substrate, and/or a PCB. In one embodiment, device package 610 may be substantially similar to the semiconductor packages of FIGS. 1, 2A-2C, 3A-3B, 4A-4D, and 5 described herein. Device package 610 may include the first and second conductive layers may be comprised of highly thermal conductive materials, have different thicknesses, and have substantially coplanar top surfaces that are respectively disposed on the devices as described herein (e.g., as illustrated and described above with the first and second (or third) conductive layers of FIGS. 1, 2A-2C, 3A-3B, 4A-4D, and 5)—or any other components from the figures described herein.

Note that device package 610 may be a single component/device, a subset of components, and/or an entire system, as the materials, features, and components may be limited to device package 610 and/or any other component of the computing device 600 that may need the first and second (or third) conductive layers as described herein (e.g., the motherboard 602, the processor 604, and/or any other component of the computing device 600 that may need the embodiments of these conductive layers, conductive slugs, and/or the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip 606 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a first die and a third die on a package substrate, wherein the first die is adjacent to the third die; a second die on the first die, wherein the second die has a top surface that is below a top surface of the third die; an encapsulation layer over the first die, wherein the encapsulation layer surrounds the second die; a first conductive layer on the second die and the encapsulation layer; and a second conductive layer on the third die, wherein the second conductive layer has a thickness that is less than a thickness of the first conductive layer, and wherein the second conductive layer has a top surface that is substantially coplanar to a top surface of the first conductive layer.

In example 2, the subject matter of example 1 can optionally include that the first and second conductive layers are comprised of copper, silver, boron nitride, or graphene.

In example 3, the subject matter of examples 1-2 can optionally include that the top surface of the second die is substantially coplanar to a top surface of the encapsulation layer, and wherein the encapsulation layer is directly on a top surface of the first die.

In example 4, the subject matter of examples 1-3 can optionally include that the first conductive layer has a width that is equal to a width of the first die, and wherein the first conductive layer has the width that is greater than a width of the second die.

In example 5, the subject matter of examples 1-4 can optionally include that a bridge in the package substrate, wherein the bridge communicatively couples the first die to the third die; an adhesive layer directly couples the first die onto the package substrate; a plurality of solder balls directly couple the third die onto the package substrate; a plurality of interconnects in the first die, wherein the plurality of interconnects of the first die couple the package substrate to the second die; a first TIM directly on the first conductive layer; a second TIM directly on the second conductive layer; and an IHS over the first TIM, the second TIM, and the package substrate, wherein the first TIM is positioned directly between the first conductive layer and the IHS, and wherein the second TIM is positioned directly between the second conductive layer and the IHS.

In example 6, the subject matter of examples 1-5 can optionally include that the first TIM has a thickness that is substantially equal to a thickness of the second TIM.

In example 7, the subject matter of examples 1-6 can optionally include that the third die is a stack of dies, a HBM die, or a stack of HBM dies.

In example 8, the subject matter of examples 1-7 can optionally include that the first conductive layer entirely covers both the top surfaces of the encapsulation layer and the second die, and wherein the third die has a thickness that is greater than a combined thickness of the first and second dies.

Example 9 is a semiconductor package, comprising: a first bottom die and a second bottom die on a package substrate, wherein the first bottom die is adjacent to the second bottom die; a third die on the package substrate, wherein the third die is adjacent to the second bottom die; a plurality of first top dies on the first bottom die, and a plurality of second top dies on the second bottom die, wherein the plurality of first and second top dies have top surfaces that are below a top surface of the third die; an encapsulation layer over the first and second bottom dies, wherein the encapsulation layer surrounds the plurality of first and second top dies; a first conductive layer on the encapsulation layer and the plurality of first and second top dies; a second conductive layer on the third die, wherein the second conductive layer has a thickness that is less than a thickness of the first conductive layer, and wherein the second conductive layer has a top surface that is substantially coplanar to a top surface of the first conductive layer; a first TIM directly on the first conductive layer; a second TIM directly on the second conductive layer; and an IHS over the first TIM, the second TIM, and the package substrate.

In example 10, the subject matter of example 9 can optionally include that the first and second conductive layers are comprised of copper, silver, boron nitride, or graphene.

In example 11, the subject matter of examples 9-10 can optionally include that the top surfaces of the plurality of first and second top dies are substantially coplanar to a top surface of the encapsulation layer, and wherein the encapsulation layer is directly on top surfaces of the first and second bottom die.

In example 12, the subject matter of examples 9-11 can optionally include that the first bottom die and the second bottom die are separated by a slight gap, wherein the first conductive layer has a width that is equal to a combined width of the first bottom die, the second bottom die, and the slight gap, and wherein the first conductive layer has the width that is greater than a combined width of the plurality of first and second top dies.

In example 13, the subject matter of examples 9-12 can optionally include that a plurality of bridges in the package substrate, wherein the plurality of bridges communicatively couple the first bottom die, the second bottom die, and the third die; an adhesive layer directly couples the first and second bottom dies onto the package substrate; a plurality of solder balls directly couple the third die onto the package substrate; and a plurality of interconnects in the first and second bottom dies, wherein the plurality of interconnects of the first and second bottom dies couple the package substrate to the plurality of respective first and second top dies.

In example 14, the subject matter of examples 9-13 can optionally include that the first TIM has a thickness that is substantially equal to a thickness of the second TIM, wherein the first TIM is positioned directly between the first conductive layer and the IHS, and wherein the second TIM is positioned directly between the second conductive layer and the IHS.

In example 15, the subject matter of examples 9-14 can optionally include that the third die is a stack of dies, a HBM die, or a stack of HBM dies.

In example 16, the subject matter of examples 9-15 can optionally include that the first conductive layer entirely covers both the top surfaces of the encapsulation layer and the plurality of first and second top dies.

In example 17, the subject matter of examples 9-16 can optionally include that the third die has a thickness that is greater than a combined thickness of the first bottom die and the plurality of first top dies, and wherein the third die has the thickness that is greater than a combined thickness of the second bottom die and the plurality of second top dies.

Example 18 is a method to form a semiconductor package, comprising: disposing a first bottom die and a second bottom die on a package substrate, wherein the first bottom die is adjacent to the second bottom die; disposing a third die on the package substrate, wherein the third die is adjacent to the second bottom die; disposing a plurality of first top dies on the first bottom die, and disposing a plurality of second top dies on the second bottom die, wherein the plurality of first and second top dies have top surfaces that are below a top surface of the third die; disposing an encapsulation layer over the first and second bottom dies, wherein the encapsulation layer surrounds the plurality of first and second top dies; disposing a first conductive layer on the encapsulation layer and the plurality of first and second top dies, and disposing a second conductive layer on the third die; polishing a top surface of the first conductive layer and a top surface of the second conductive layer, wherein the top surface of the first conductive layer is substantially coplanar to the top surface of the second conductive layer, and wherein the second conductive layer has a thickness that is less than a thickness of the first conductive layer; disposing a first TIM directly on the first conductive layer, and disposing a second TIM directly on the second conductive layer; and disposing an IHS over the first TIM, the second TIM, and the package substrate.

In example 19, the subject matter of example 18 can optionally include that the first and second conductive layers are comprised of copper, silver, boron nitride, or graphene.

In example 20, the subject matter of examples 18-19 can optionally include that the top surfaces of the plurality of first and second top dies have are substantially coplanar to a top surface of the encapsulation layer, and wherein the encapsulation layer is directly on top surfaces of the first and second bottom die.

In example 21, the subject matter of examples 18-20 can optionally include that the first bottom die and the second bottom die are separated by a slight gap, wherein the first conductive layer has a width that is equal to a combined width of the first bottom die, the second bottom die, and the slight gap, and wherein the first conductive layer has the width that is greater than a combined width of the plurality of first and second top dies.

In example 22, the subject matter of examples 18-21 can optionally include disposing a plurality of bridges in the package substrate, wherein the plurality of bridges communicatively couple the first bottom die, the second bottom die, and the third die; directly coupling the first and second bottom dies onto the package substrate with an adhesive layer; directly coupling the third die onto the package substrate with a plurality of solder balls; and disposing a plurality of interconnects in the first and second bottom dies, wherein the plurality of interconnects of the first and second bottom dies couple the package substrate to the plurality of respective first and second top dies.

In example 23, the subject matter of examples 18-22 can optionally include that the first TIM has a thickness that is substantially equal to a thickness of the second TIM, wherein the first TIM is positioned directly between the first conductive layer and the IHS, and wherein the second TIM is positioned directly between the second conductive layer and the IHS.

In example 24, the subject matter of examples 18-23 can optionally include that the third die is a stack of dies, a high bandwidth memory (HBM) die, or a stack of HBM dies.

In example 25, the subject matter of examples 18-24 can optionally include that the first conductive layer entirely covers both the top surfaces of the encapsulation layer and the plurality of first and second top dies, wherein the third die has a thickness that is greater than a combined thickness of the first bottom die and the plurality of first top dies, and wherein the third die has the thickness that is greater than a combined thickness of the second bottom die and the plurality of second top dies.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:
1. A semiconductor package, comprising:
a first microelectronic device and a second microelectronic device on a package substrate, wherein the first microelectronic device has a top surface that is substantially coplanar to a top surface of the second microelectronic device;
a third microelectronic device on the package substrate, wherein the third microelectronic device has a top surface positioned above the top surfaces of the first and second microelectronic devices;

a first conductive layer on the first and second microelectronic devices;

a second conductive layer on the third microelectronic device, wherein the second conductive layer has a thickness that is less than a thickness of the first conductive layer, and wherein the second conductive layer has a top surface that is substantially coplanar to a top surface of the first conductive layer; and a first thermal interface material (TIM) on the first conductive layer, and a second TIM on the second conductive layer.

2. The semiconductor package of claim 1, wherein the first and second conductive layers are comprised of copper, silver, boron nitride, or graphene.

3. The semiconductor package of claim 1, wherein the first microelectronic device is adjacent to the second microelectronic device, and wherein the third microelectronic device is adjacent to the second microelectronic device.

4. The semiconductor package of claim 1, wherein the first microelectronic device includes a plurality of first top dies on a first bottom die, wherein the second microelectronic device includes a plurality of second top dies on a second bottom die, and wherein the third microelectronic device is comprised of a die, a stack of dies, a high bandwidth memory (HBM) die, or a stack of HBM dies.

5. The semiconductor package of claim 1, wherein the first TIM is directly on the top surface of the first conductive layer, wherein the second TIM is directly on the top surface of the second conductive layer, wherein the first TIM has a thickness that is substantially equal to a thickness of the second TIM, wherein the first conductive layer has a width that is equal to or greater than a width of the first and second microelectronic devices, and wherein the second conductive layer has a width that is equal to a width of the third microelectronic device.

6. The semiconductor package of claim 4, further comprising:

an encapsulation layer on a top surface of the first bottom die and a top surface of the second bottom die, wherein the encapsulation layer has a top surface that is substantially coplanar to top surfaces of the plurality of first and second top dies, wherein the first conductive layer is directly on the top surfaces of the encapsulation layer and the plurality of first and second top dies, and wherein the second conductive layer is directly on the top surface of the third microelectronic device;

a plurality of bridges in the package substrate, wherein the plurality of bridges communicatively couple the first, second, and third microelectronic devices;

an adhesive layer directly couples the first and second microelectronic devices onto the package substrate;

a plurality of solder balls directly couple the third microelectronic device onto the package substrate;

a plurality of interconnects in the first and second bottom dies; and an integrated heat spreader (IHS) directly on a top surface of the first TIM and a top surface of the second TIM, wherein the first TIM is positioned directly between the first conductive layer and the IHS, and wherein the second TIM is positioned directly between the second conductive layer and the IHS.

7. The semiconductor package of claim 1, wherein the first conductive layer is comprised of a shared first conductive layer or a separated first conductive layer, wherein the shared first conductive layer covers both the first and second microelectronic devices, or the separated first conductive layer has a first portion that only covers the first microelectronic device, and a second portion that only covers the second microelectronic device, wherein the first TIM is comprised of a shared first TIM or a separated first TIM, and wherein the shared first TIM covers both the first and second microelectronic devices, or the separated first TIM has a first portion that only covers the first microelectronic device, and a second portion that only covers the second microelectronic device.

8. The semiconductor package of claim 1, wherein the third microelectronic device has a thickness that is greater than a thickness of the first and second microelectronic devices.

9. The semiconductor package of claim 1, further comprising a plurality of conductive slugs coupled to a periphery region of a bottom surface of the first conductive layer, wherein the plurality of conductive slugs are comprised of one or more different shapes, and wherein the one or more different shapes of the plurality of conductive slugs include rectangular conductive slugs, L-shaped conductive slugs, Z-shaped conductive slugs, circular conductive slugs, or trapezoidal conductive slugs.

10. A semiconductor package, comprising:

a first microelectronic device and a second microelectronic device on a package substrate, wherein the first microelectronic device has a top surface that is substantially coplanar to a top surface of the second microelectronic device;

a third microelectronic device on the package substrate;

a first conductive layer on the first and second microelectronic devices;

a second conductive layer on the third microelectronic device, wherein the second conductive layer has a thickness that is different than a thickness of the first conductive layer, and wherein the second conductive layer has a top surface that is substantially coplanar to a top surface of the first conductive layer;

a first thermal interface material (TIM) on the first conductive layer, and a second TIM on the second conductive layer, wherein the first TIM has a thickness that is substantially equal to a thickness of the second TIM;

an integrated heat spreader (IHS) on the first and second TIMs; and a plurality of conductive slugs coupled to a periphery region of a bottom surface of the first conductive layer.

11. The semiconductor package of claim 10, wherein the first and second conductive layers and the plurality of conductive slugs are comprised of copper, silver, boron nitride, or graphene, and wherein the thickness of the second conductive layer is greater or less than a thickness of the first conductive layer.

12. The semiconductor package of claim 10, wherein the first microelectronic device is adjacent to the second microelectronic device, and wherein the third microelectronic device is adjacent to the second microelectronic device.

13. The semiconductor package of claim 10, wherein the first microelectronic device includes a plurality of first top dies on a first bottom die, wherein the second microelectronic device includes a plurality of second top dies on a second bottom die, wherein the third microelectronic device is comprised of a die, a stack of dies, a high bandwidth memory (HBM) die, or a stack of HBM dies, and wherein the third microelectronic device has a top surface positioned above or below the top surfaces of the first and second microelectronic devices.

14. The semiconductor package of claim 10, wherein the first TIM is directly on the top surface of the first conductive layer, wherein the second TIM is directly on the top surface of the second conductive layer, wherein the first conductive layer has a width that is equal to or greater than a width of the first and second microelectronic devices, and wherein the second conductive layer has a width that is equal to a width of the third microelectronic device.

15. The semiconductor package of claim 13, further comprising:
an encapsulation layer on a top surface of the first bottom die and a top surface of the second bottom die, wherein the encapsulation layer has a top surface that is substantially coplanar to top surfaces of the plurality of first and second top dies, wherein the first conductive layer is directly on the top surfaces of the encapsulation layer and the plurality of first and second top dies, and wherein the second conductive layer is directly on the top surface of the third microelectronic device;
a plurality of bridges in the package substrate, wherein the plurality of bridges communicatively couple the first, second, and third microelectronic devices;
an adhesive layer directly couples the first and second microelectronic devices onto the package substrate;
a plurality of solder balls directly couple the third microelectronic device onto the package substrate; and
a plurality of interconnects in the first and second bottom dies, wherein the first TIM is positioned directly between the first conductive layer and the IHS, and wherein the second TIM is positioned directly between the second conductive layer and the IHS.

16. The semiconductor package of claim 15, wherein the first conductive layer is comprised of a shared first conductive layer or a separated first conductive layer, wherein the shared first conductive layer covers both the first and second microelectronic devices, or the separated first conductive layer has a first portion that only covers the first microelectronic device, and a second portion that only covers the second microelectronic device, wherein the first TIM is comprised of a shared first TIM or a separated first TIM, and wherein the shared first TIM covers both the first and second microelectronic devices, or the separated first TIM has a first portion that only covers the first microelectronic device, and a second portion that only covers the second microelectronic device.

17. The semiconductor package of claim 15, wherein the third microelectronic device has a thickness that is different than a thickness of the first and second microelectronic devices.

18. The semiconductor package of claim 10, wherein the plurality of conductive slugs are comprised of one or more different shapes, and wherein the one or more different shapes of the plurality of conductive slugs include rectangular conductive slugs, L-shaped conductive slugs, Z-shaped conductive slugs, circular conductive slugs, or trapezoidal conductive slugs.

19. A method to form a semiconductor package, comprising:
disposing a first microelectronic device and a second microelectronic device on a package substrate, wherein the first microelectronic device has a top surface that is substantially coplanar to a top surface of the second microelectronic device;
disposing a third microelectronic device on the package substrate, wherein the third microelectronic device has a top surface positioned above the top surfaces of the first and second microelectronic devices;
disposing a first conductive layer on the first and second microelectronic devices;
disposing a second conductive layer on the third microelectronic device;
polishing the first and second conductive layers, wherein the second conductive layer has a top surface that is substantially coplanar to a top surface of the first conductive layer, and wherein the second conductive layer has a thickness that is less than a thickness of the first conductive layer; and
disposing a first thermal interface material (TIM) on the first conductive layer, and a second TIM on the second conductive layer.

20. The method of claim 19, wherein the first and second conductive layers are comprised of copper, silver, boron nitride, or graphene, wherein the first microelectronic device is adjacent to the second microelectronic device, and wherein the third microelectronic device is adjacent to the second microelectronic device.

21. The method of claim 19, wherein the first microelectronic device includes a plurality of first top dies on a first bottom die, wherein the second microelectronic device includes a plurality of second top dies on a second bottom die, and wherein the third microelectronic device is comprised of a die, a stack of dies, a high bandwidth memory (HBM) die, or a stack of HBM dies.

22. The method of claim 19, wherein the first TIM is directly on the top surface of the first conductive layer, wherein the second TIM is directly on the top surface of the second conductive layer, wherein the first TIM has a thickness that is substantially equal to a thickness of the second TIM, wherein the first conductive layer has a width that is equal to or greater than a width of the first and second microelectronic devices, wherein the second conductive layer has a width that is equal to a width of the third microelectronic device, and wherein the third microelectronic device has a thickness that is greater than a thickness of the first and second microelectronic devices.

23. The method of claim 21, further comprising:
disposing an encapsulation layer on a top surface of the first bottom die and a top surface of the second bottom die, wherein the encapsulation layer has a top surface that is substantially coplanar to top surfaces of the plurality of first and second top dies, wherein the first conductive layer is directly on the top surfaces of the encapsulation layer and the plurality of first and second top dies, and wherein the second conductive layer is directly on the top surface of the third microelectronic device;
disposing a plurality of bridges in the package substrate, wherein the plurality of bridges communicatively couple the first, second, and third microelectronic devices;
coupling the first and second microelectronic devices directly onto the package substrate with an adhesive layer;
disposing a plurality of solder balls directly couple the third microelectronic device onto the package substrate;
disposing a plurality of interconnects in the first and second bottom dies; and
disposing an integrated heat spreader (IHS) directly on a top surface of the first TIM and a top surface of the second TIM, wherein the first TIM is positioned directly between the first conductive layer and the IHS, and wherein the second TIM is positioned directly between the second conductive layer and the IHS.

24. The method of claim 23, wherein the first conductive layer is comprised of a shared first conductive layer or a separated first conductive layer, wherein the shared first conductive layer covers both the first and second microelectronic devices, or the separated first conductive layer has a first portion that only covers the first microelectronic device, and a second portion that only covers the second microelectronic device, wherein the first TIM is comprised of a shared first TIM or a separated first TIM, and wherein the shared first TIM covers both the first and second microelectronic devices, or the separated first TIM has a first portion that only covers the first microelectronic device, and a second portion that only covers the second microelectronic device.

25. The method of claim 19, further comprising a plurality of conductive slugs coupled to a periphery region of a bottom surface of the first conductive layer, wherein the plurality of conductive slugs are comprised of one or more different shapes, and wherein the one or more different shapes of the plurality of conductive slugs include rectangular conductive slugs, L-shaped conductive slugs, Z-shaped conductive slugs, circular conductive slugs, or trapezoidal conductive slugs.

* * * * *